(12) United States Patent
Yang et al.

(10) Patent No.: US 12,295,116 B2
(45) Date of Patent: May 6, 2025

(54) ELECTRONIC DEVICE

(71) Applicant: GETAC TECHNOLOGY CORPORATION, New Taipei (TW)

(72) Inventors: Jui-Lin Yang, Taipei (TW); Wan-Lin Hsu, Taipei (TW); Hsin-Chih Chou, Taipei (TW); Kun-Cheng Lee, Taipei (TW); Juei-Chi Chang, Taipei (TW)

(73) Assignee: Getac Technology Corporation, New Taipei (TW)

( * ) Notice: Subject to any disclaimer, the term of this patent is extended or adjusted under 35 U.S.C. 154(b) by 236 days.

(21) Appl. No.: 17/981,342

(22) Filed: Nov. 4, 2022

(65) Prior Publication Data

US 2023/0262923 A1    Aug. 17, 2023

Related U.S. Application Data

(60) Provisional application No. 63/309,463, filed on Feb. 11, 2022.

(30) Foreign Application Priority Data

Sep. 19, 2022    (CN) .......................... 202211138206.1

(51) Int. Cl.
*H05K 7/20*    (2006.01)
(52) U.S. Cl.
CPC ..... *H05K 7/20154* (2013.01); *H05K 7/20172* (2013.01); *H05K 7/20409* (2013.01); *H05K 7/20445* (2013.01)
(58) Field of Classification Search
CPC ........... H05K 7/20154; H05K 7/20172; H05K 7/20409; H05K 7/20445; G06F 1/181; G06F 1/203; G06F 1/206; G06F 1/1632
See application file for complete search history.

(56) References Cited

U.S. PATENT DOCUMENTS 5,305,180 A    4/1994    Mitchell et al.
5,432,673 A    7/1995    Ogami et al.
(Continued)

FOREIGN PATENT DOCUMENTS

CN    101742872 A  *  6/2010
CN    103781330 A     5/2014
(Continued)

OTHER PUBLICATIONS

Hongchang Huang; Zhikai Sun; Kaicheng Tian; Zhijie Zhou, "Radiation module and electronic device using same", Jun. 16, 2010, Pegatron Corp, Entire Document (Translation of CN 101742872). (Year: 2010).*

(Continued)

*Primary Examiner* — Stephen S Sul
(74) *Attorney, Agent, or Firm* — Cooper Legal Group, LLC

(57) ABSTRACT

An electronic device includes: a body, including opposite outer and inner surfaces, and a through opening passing through the outer and inner surfaces; a fan, disposed on the outer surface and having an air outlet; a heat sink assembly, disposed at the air outlet and corresponding to the through opening; a first thermal tube, having one end assembled on the heat sink assembly and located on the side of the outer surface; a first heat source, disposed corresponding to the other end of the first thermal tube; a thermal plate, disposed in the body and corresponding to the through opening, having one side abutting against the heat sink assembly and the inner surface; a second thermal tube, having one end connected to the other side of the thermal plate; and a second heat source, disposed corresponding to the other end of the second thermal tube.

20 Claims, 15 Drawing Sheets

(56) References Cited

U.S. PATENT DOCUMENTS

| | | | |
|---|---|---|---|
| 6,353,536 B1 * | 3/2002 | Nakamura | G06F 1/20 |
| | | | 361/679.41 |
| 6,621,698 B2 | 9/2003 | Chang | |
| 6,914,780 B1 | 7/2005 | Shanker et al. | |
| 7,325,590 B2 * | 2/2008 | Kim | G06F 1/203 |
| | | | 165/122 |
| 9,310,858 B2 | 4/2016 | Yang | |
| 9,535,459 B2 | 1/2017 | Lee et al. | |
| 11,310,940 B2 * | 4/2022 | Moon | G06F 1/203 |
| 11,474,566 B2 | 10/2022 | Chang et al. | |
| 11,751,431 B2 | 9/2023 | Park et al. | |
| 11,899,506 B2 | 2/2024 | Cavallaro et al. | |
| 2006/0126290 A1 * | 6/2006 | Park | G06F 1/1632 |
| | | | 361/679.55 |
| 2009/0046428 A1 | 2/2009 | Hung et al. | |
| 2009/0168331 A1 | 7/2009 | Fujiwara | |
| 2011/0186269 A1 * | 8/2011 | Yang | H01L 23/467 |
| | | | 165/104.26 |
| 2011/0222237 A1 | 9/2011 | Fujiwara et al. | |
| 2014/0063732 A1 * | 3/2014 | Lee | G06F 1/203 |
| | | | 361/679.54 |
| 2014/0078679 A1 | 3/2014 | Tsunoda et al. | |
| 2016/0286099 A1 | 9/2016 | Godil et al. | |
| 2020/0383232 A1 | 12/2020 | Gary | |
| 2021/0118764 A1 | 4/2021 | Lin et al. | |
| 2021/0278880 A1 | 9/2021 | Chang et al. | |
| 2021/0318734 A1 | 10/2021 | Hoffmeyer et al. | |
| 2023/0038904 A1 | 2/2023 | Hsu et al. | |
| 2024/0206129 A1 | 6/2024 | Cai et al. | |

FOREIGN PATENT DOCUMENTS

| | | | | |
|---|---|---|---|---|
| CN | 104780735 A | | 7/2015 | |
| CN | 104066298 B | | 2/2017 | |
| CN | 103781330 B | | 6/2017 | |
| CN | 104066298 A | | 9/2017 | |
| CN | 108735691 A | * | 11/2018 | G06F 1/203 |
| EP | 3764760 A1 | | 1/2021 | |
| EP | 3876075 A1 | | 9/2021 | |
| TW | 233051 U | | 10/1994 | |
| TW | M407417 U | | 7/2011 | |
| TW | 201200995 A | | 1/2012 | |
| TW | I573521 B | | 3/2017 | |
| WO | 2017208487 A1 | | 12/2017 | |
| WO | 2021221364 A1 | | 11/2021 | |

OTHER PUBLICATIONS

Wu Qirong, "Electronic device and heat radiating structure of electronic device", Sep. 24, 2014, Shenxun Comp Kunshan Co Ltd; Mitac Technology Corp, Entire Document (Translation of CN 104066298) (of record, cited in the IDS, including Original Document). (Year: 2014).*

Li Yichen; Zhang Tingyin; Gong Zhenxing; Wang Xiaolong, "Cooling method and device of portable computer high-power BGA package chip", Nov. 2, 2018, Shandong Chaoyue CNC Electronics Co Ltd, Entire Document (Translation of CN 108735691) (Year: 2018).*

European Patent Office, Search Report, Application No. 22209288.4, Jul. 11, 2023, Germany.

* cited by examiner

ELECTRONIC DEVICE

The application claims the benefit of a U.S. Provisional Patent Application No. 63/309,463, filed on Feb. 11, 2022, the disclosure of which is hereby incorporated by reference herein in its entirety. The application further claims priority to a CN Patent Application No. 202211138206.1, filed on Sep. 19, 2022, the disclosure of which is also hereby incorporated by reference herein in its entirety.

BACKGROUND OF THE INVENTION

Field of the Invention

The present invention relates to an electronic device and, more particularly, to an electronic device having a heat dissipation mechanism.

Description of the Prior Art

With the popularity of electronic devices, users demand ever-increasing higher requirements on electronic devices, such as having diversified functions and sufficient performance for smooth operations. Heat energy generated during operations of the electronic devices is one of the important factors that directly affect operation efficiency, and so it is obvious that the importance of heat dissipation mechanisms in the electronic devices is critical.

However, as the number of internal components of the electronic devices continues increasing and a common heat dissipation mechanism need to be provided with a fan and a heat sink, it is a vital task as how to provide a solution that satisfies both space utilization efficiency and heat dissipation requirements.

SUMMARY OF THE INVENTION

The present invention provides an electronic device including a body, a fan, a heat sink assembly, a first thermal tube, a first heat source, a thermal plate, a second thermal tube and a second heat source. The body includes a through opening, and an outer surface and an inner surface opposite to each other, wherein the through opening passes through the outer surface and the inner surface. The fan is disposed on the outer surface of the body, and has an air outlet. The heat sink assembly is disposed at the air outlet and corresponds to the through opening. One end of the first thermal tube is assembled on the heat sink assembly and is located on the side of the outer surface. The first heat source is disposed at a position corresponding to the other end of the first thermal tube. The thermal plate is disposed in the body and corresponds to the through opening, and one side of the thermal plate abuts against the heat sink assembly and the inner surface. One end of the second thermal tube is connected to the other side of the thermal plate. The second heat source is disposed at a position corresponding to the other end of the second thermal tube.

Thus, the electronic device needs only one fan to dissipate heat from the first heat source and the second heat source at different positions, hence enhancing space utilization efficiency.

In some embodiments, the first heat source and the second heat source are disposed in the body and are not coplanar.

In some embodiments, the body further includes a sidewall, and the outer surface of the body includes a first portion, a second portion and a third portion. The second portion is connected at an angle to the first portion and the third portion, and the first portion and the third portion are not coplanar. The sidewall is connected to the first portion, the second portion and the third portion. The second portion, the third portion and the sidewall define a recess therebetween, and the fan is disposed in the recess.

In some embodiments, the first heat source, the second heat source and the second thermal tube are located between the sidewall and the inner surface.

In some embodiments, the sidewall includes a plurality of through holes that are in communication with the recess.

In some embodiments, the thermal plate includes a contacting portion and an abutting portion connected to each other, wherein the contacting portion passes through the through opening and abuts against the heat sink assembly, and the abutting portion abuts against the inner surface.

In some embodiments, a waterproof ring is further included. The waterproof ring is disposed on the inner surface and encircles the through opening, the contacting portion passes through the waterproof ring to abut against the heat sink assembly, and one side of the abutting portion abuts against the waterproof ring.

In some embodiments, the waterproof ring protrudes from the inner surface.

In some embodiments, the heat sink assembly includes a plurality of cooling fins. Each of the cooling fins has a first side, a second side, a third side and a fourth side. The first side and the second side are parallel and opposite to each other, the third side and the fourth side are parallel and opposite to each other, and the third side and the fourth side are respectively connected between the first side and the second side. The first side is adjacent to the fan, the first thermal tube is assembled on the third side, and the thermal plate is assembled on the fourth side.

In some embodiments, the heat sink assembly further includes an upper plate and a lower plate. The upper plate is perpendicular to the cooling fins and is disposed on the third side, the lower plate is perpendicular to the cooling fins and is disposed on the fourth side, the first thermal tube is connected to the upper plate, and the thermal plate is connected to the lower plate.

In some embodiments, the fourth side includes a first section, a second section and a third section. The first section is perpendicularly connected to first side, the third section is perpendicularly connected to the second side, the second section is perpendicularly connected to the first section and the third section, and a position of the first section corresponds to a position of the through opening.

In some embodiments, the lower plate includes a first lower plate and a second lower plate. The first lower plate is disposed on the first section, the second lower plate is disposed on the third section, and the thermal plate abuts against the first lower plate.

In some embodiments, the body further includes an expansion port, which is disposed on the outer surface and is used to expansion connect to another body.

The present invention further provides an electronic device including a body, a fan, a heat sink assembly, a first thermal tube, a first heat source, a second thermal tube and a second heat source. The fan is disposed in the body and has an air outlet. The heat sink assembly is disposed at the air outlet. One end of the first thermal tube is assembled on one side of the heat sink assembly. The first heat source is disposed in the body at a position corresponding to the other end of the first thermal tube. One end of the second thermal tube is connected to the other side of the heat sink assembly. The second heat source is disposed in the body at a position corresponding to the other end of the second thermal tube, and the second heat source and the first heat source are not coplanar.

In some embodiments, the body has a recess in which the fan and the heat sink assembly are disposed.

In some embodiments, the body has a through opening, which passes through the recess and corresponds to the heat sink assembly.

In some embodiments, the first thermal tube is located on the outer surface of the body, and the second thermal tube is located on the inner surface of the body.

In some embodiments, the electronic device further includes a waterproof ring. The waterproof ring encircles the through opening, and is sandwiched between the inner surface of the body and the second thermal tube.

In some embodiments, a portion of the heat sink assembly passes through the waterproof ring and abuts against the second thermal tube.

In some embodiments, the body further includes a plurality of through holes that are in communication with the recess.

Thus, the electronic device is capable of dissipating heat from the first heat source and the second heat source that are not coplanar on the electronic device by using one single fan, hence reducing the space needed for achieving heat dissipation and enhancing space utilization efficiency of the electronic device.

DETAILED DESCRIPTION OF THE EMBODIMENTS

Figure 1:
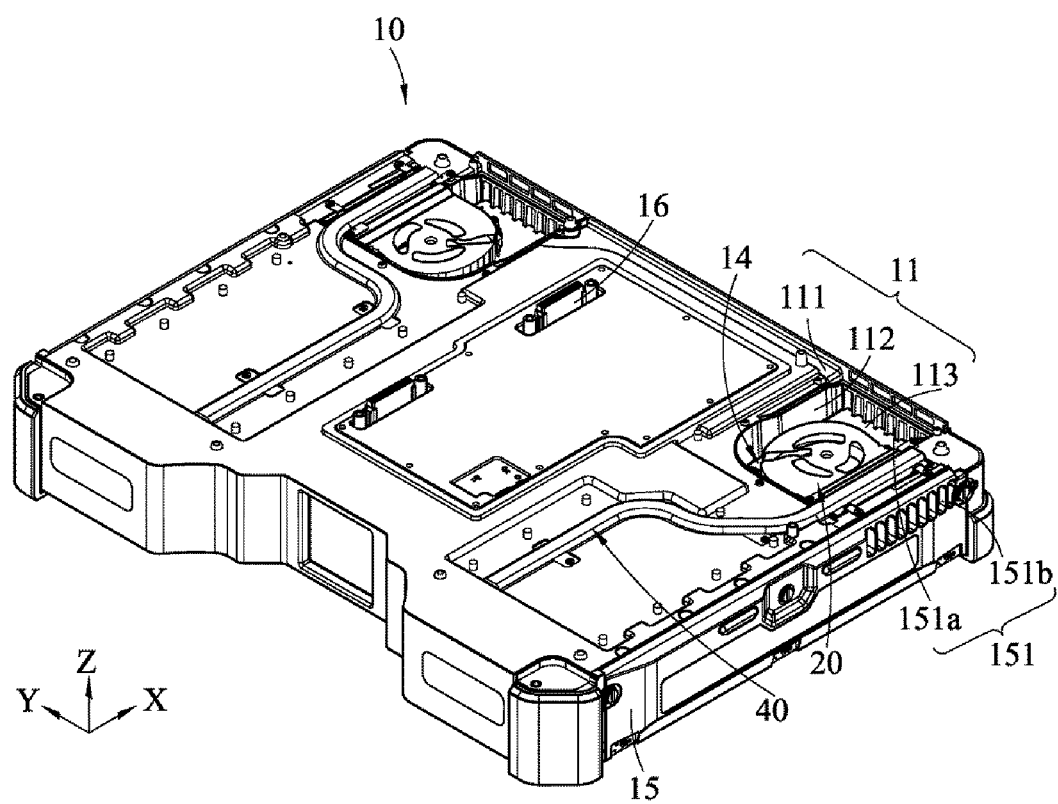
FIG. 1 is a perspective appearance schematic diagram of an electronic device according to an embodiment of the present invention.
Figure 2:
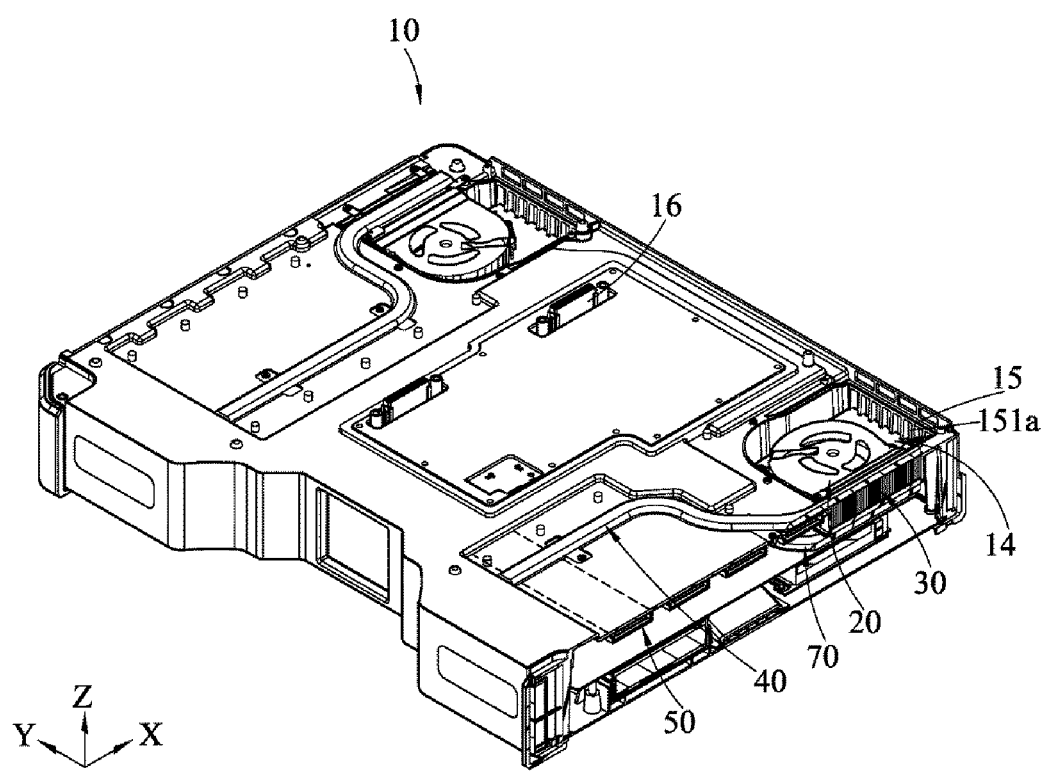
FIG. 2 is a first perspective sectional schematic diagram of an electronic device according to an embodiment of the present invention.
Figure 3:
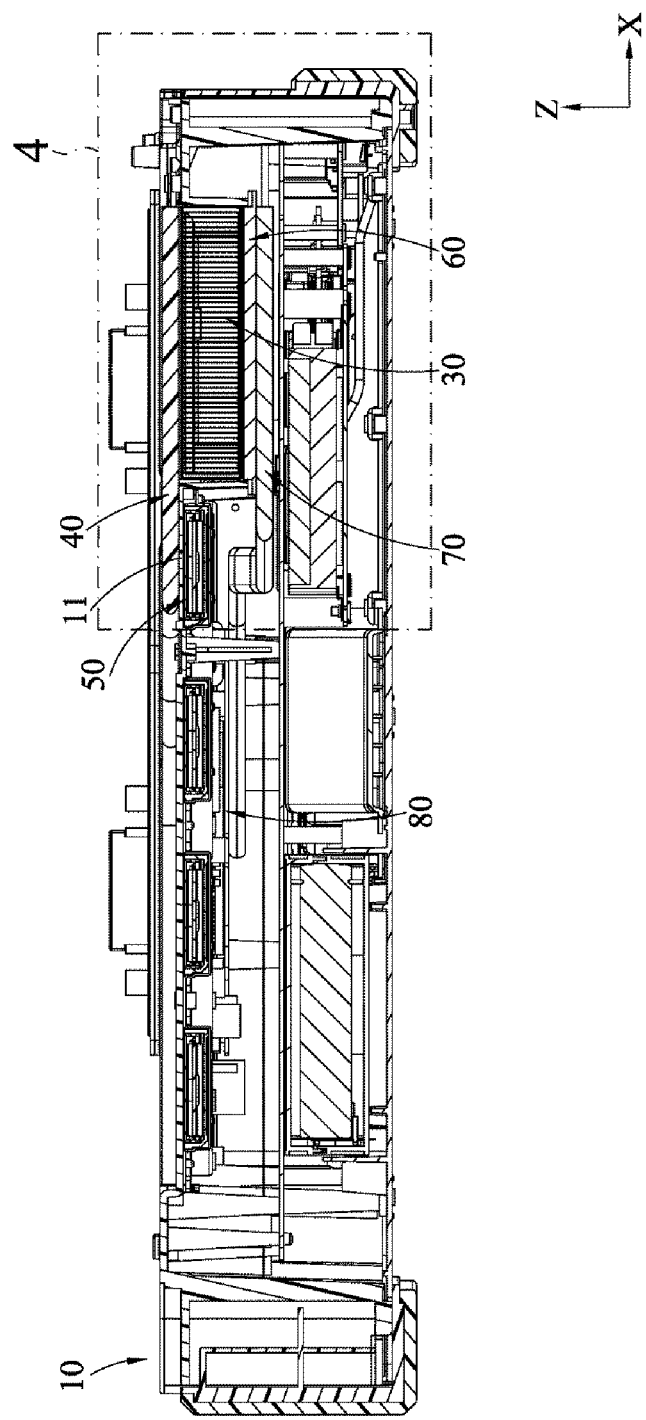
FIG. 3 is a first planar sectional schematic diagram of an electronic device according to an embodiment of the present invention.

Referring to FIG. 1 to FIG. 3, FIG. 1 shows a perspective appearance schematic diagram of an electronic device according to an embodiment of the present invention. Herein, FIG. 1 is a perspective diagram drawn according to an X direction, a Y direction and a Z direction. FIG. 2 shows a first perspective sectional schematic diagram of an electronic device according to an embodiment of the present invention, and FIG. 3 shows a first planar sectional schematic diagram of an electronic device according to an embodiment of the present invention. Herein, FIG. 3 is drawn according to an XZ planar direction defined by the X direction and the Z direction. In some embodiments, the electronic device of the present invention may be, for example but not limited to, a computer host or an expansion dock. The electronic device includes a body 10, a fan 20, a heat sink assembly 30, a first thermal tube 40, a first heat source 50, a second thermal tube 70 and a second heat source 80.

Figure 4:
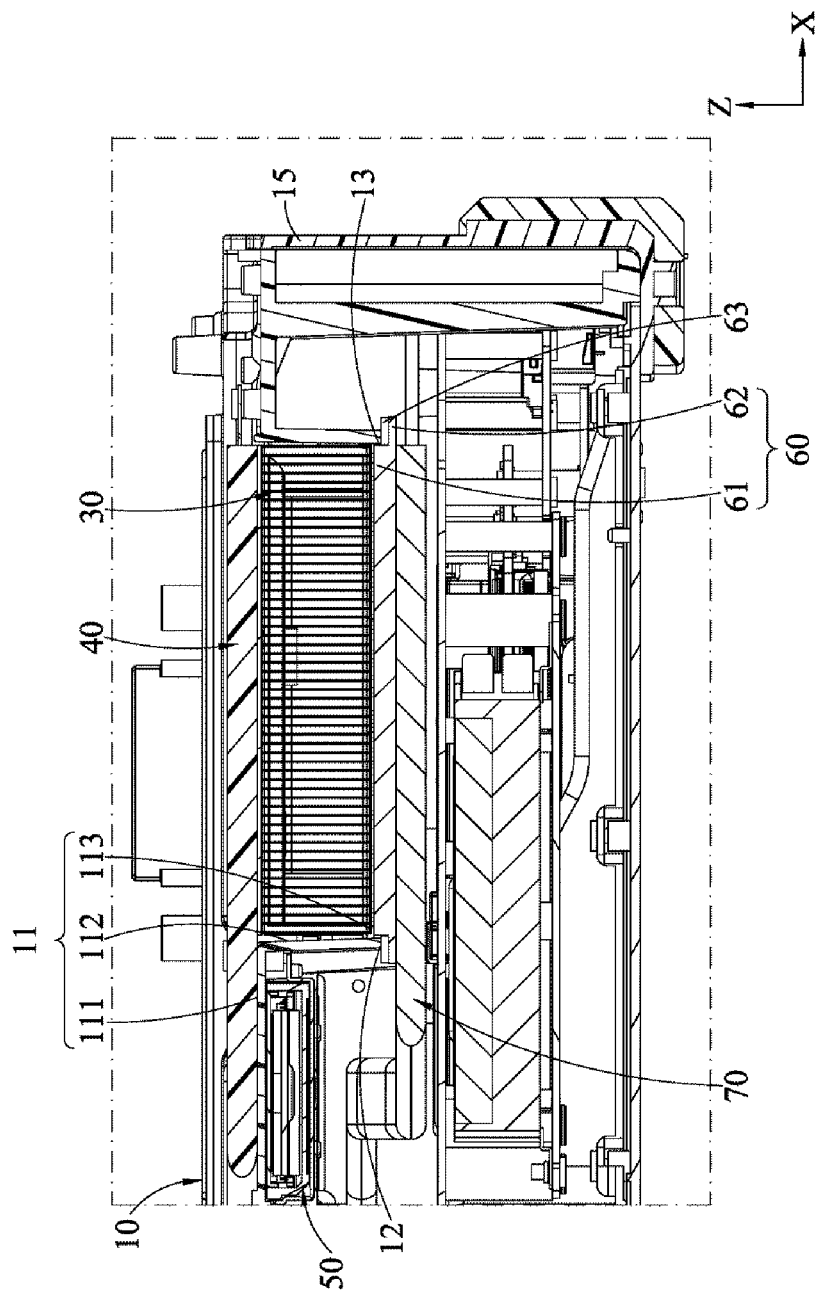
FIG. 4 is a partial enlarged schematic diagram of a circled portion 4 in FIG. 3.
Figure 5:
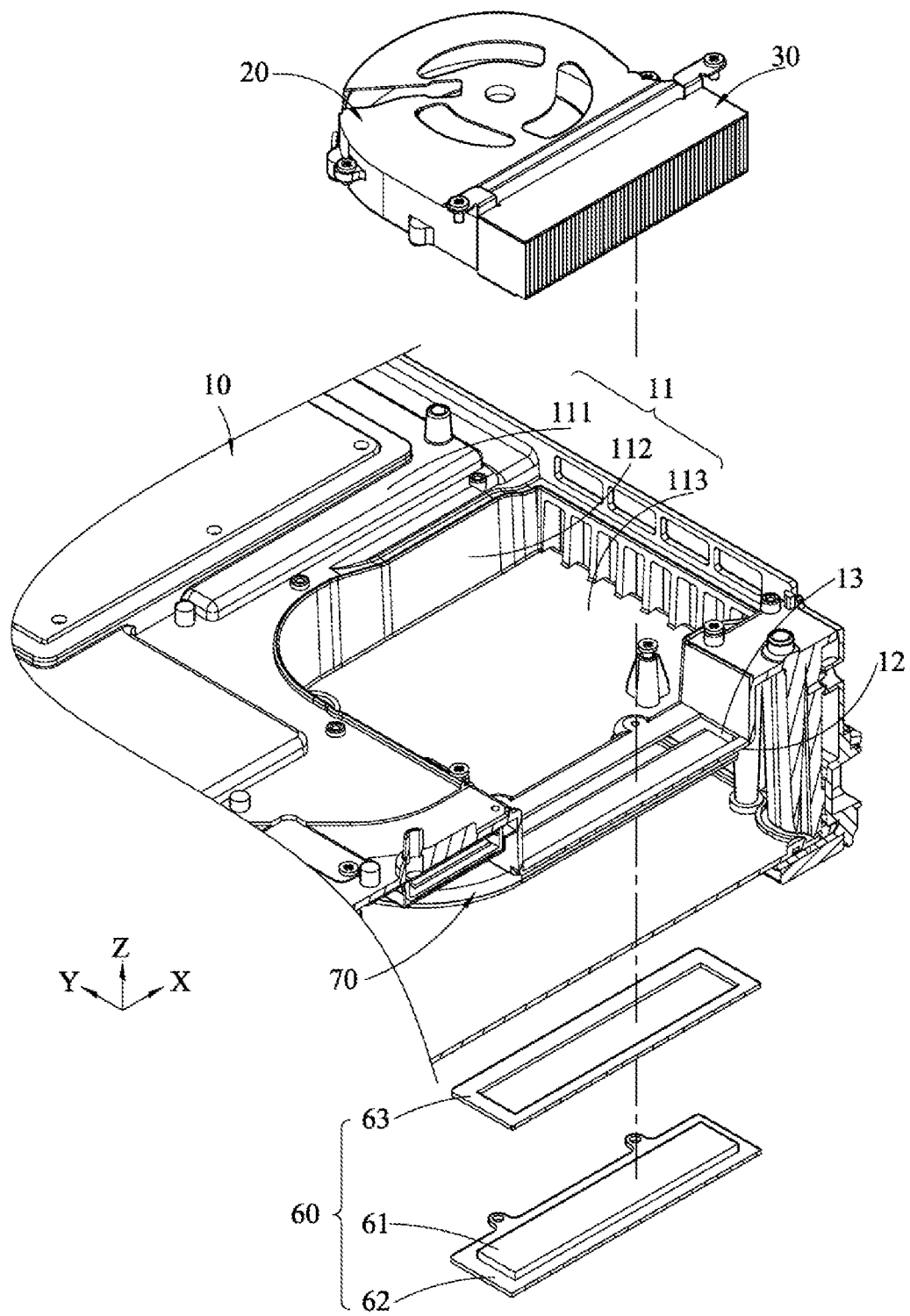
FIG. 5 is a partial exploded structural schematic diagram of an electronic device according to an embodiment of the present invention.
Figure 6:
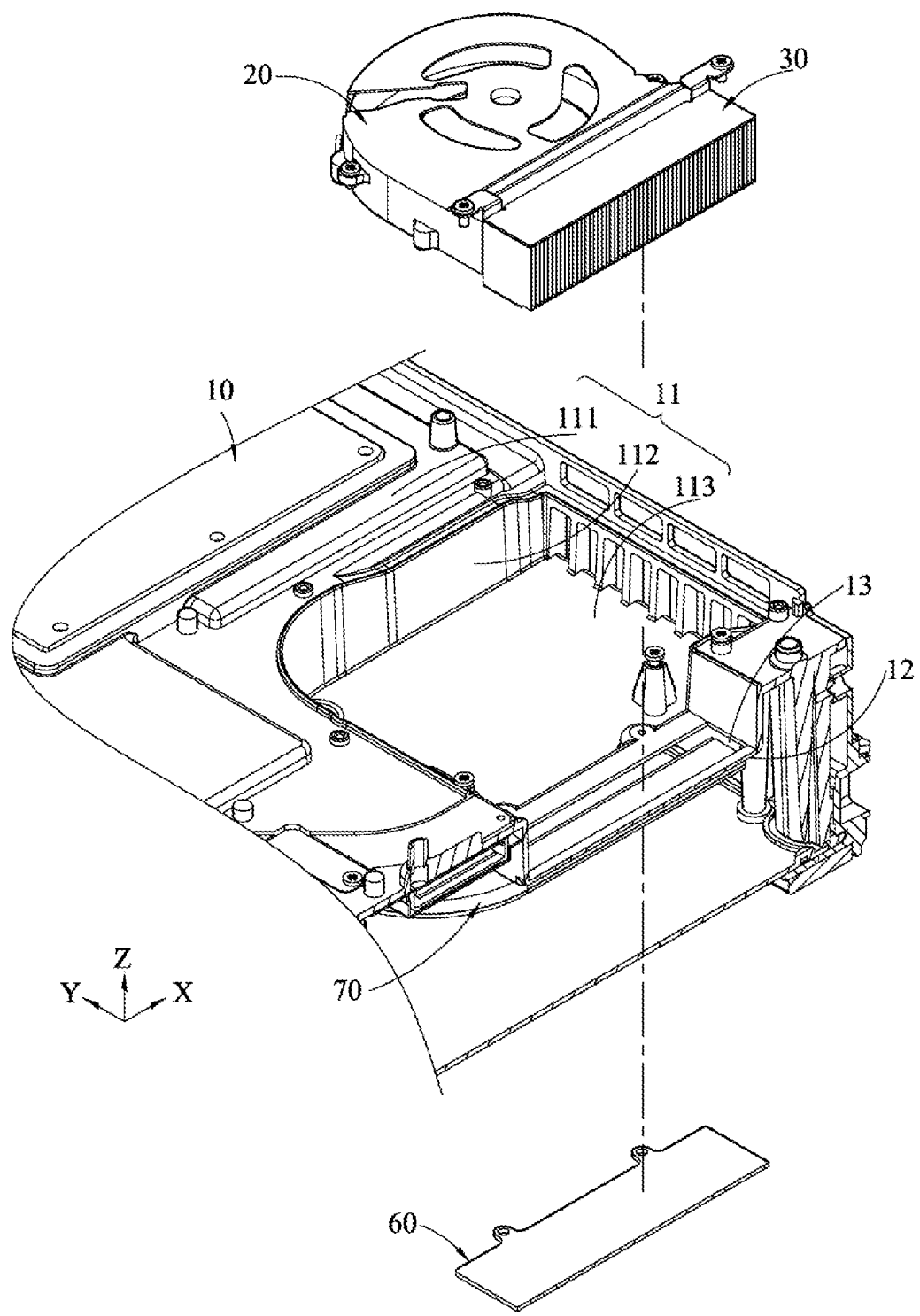
FIG. 6 is a partial exploded structural schematic diagram of an electronic device according to another embodiment of the present invention.
Figure 7:
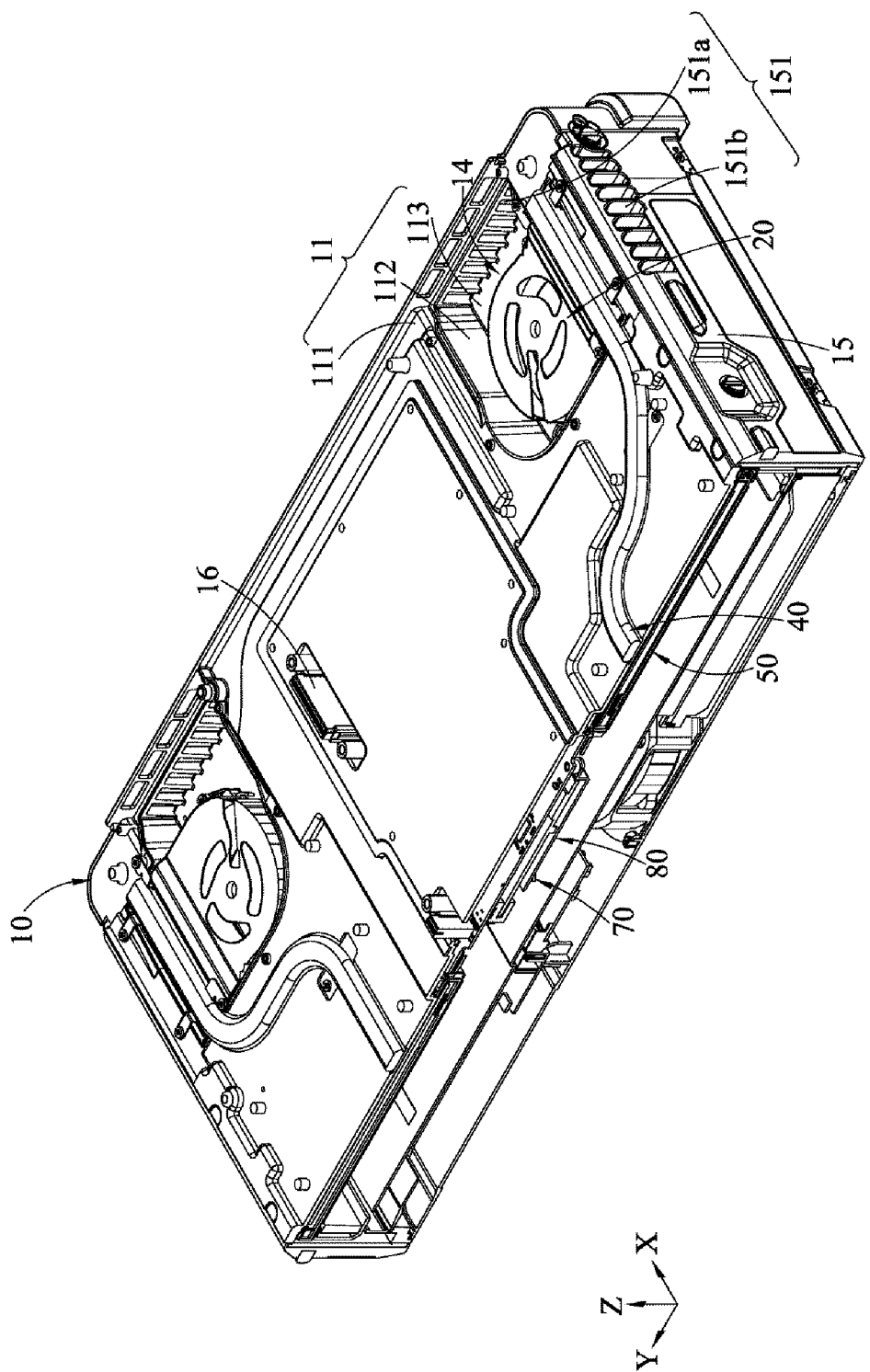
FIG. 7 is a second perspective sectional schematic diagram of an electronic device according to an embodiment of the present invention.
Figure 8:
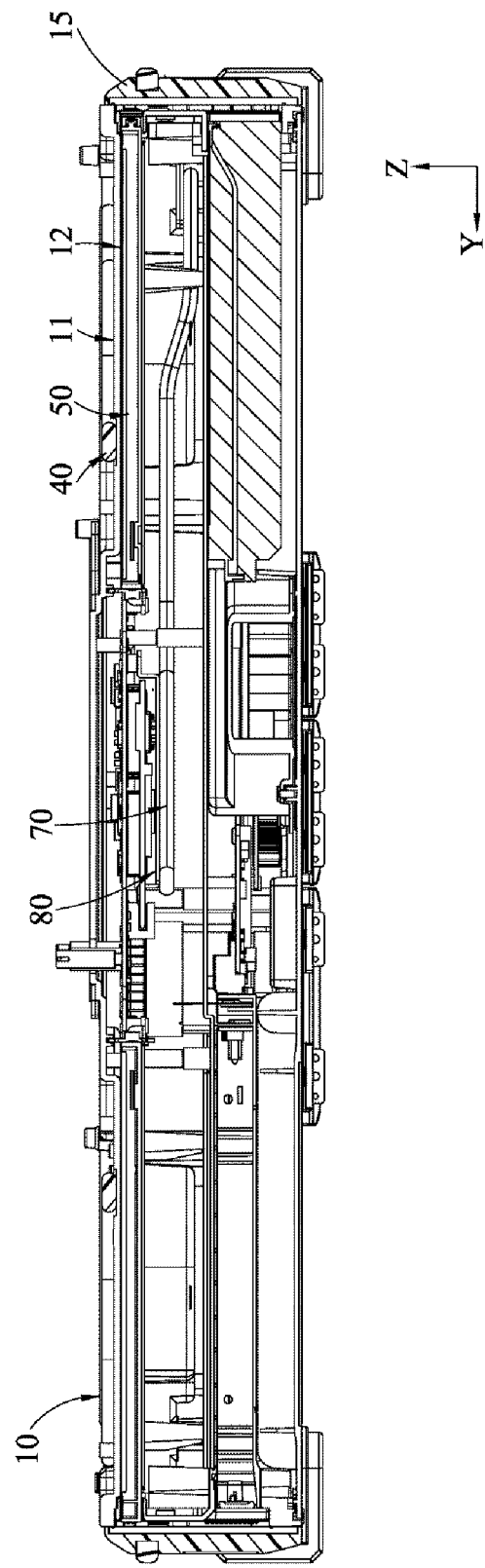
FIG. 8 is a second planar sectional schematic diagram of an electronic device according to an embodiment of the present invention.
Figure 9:
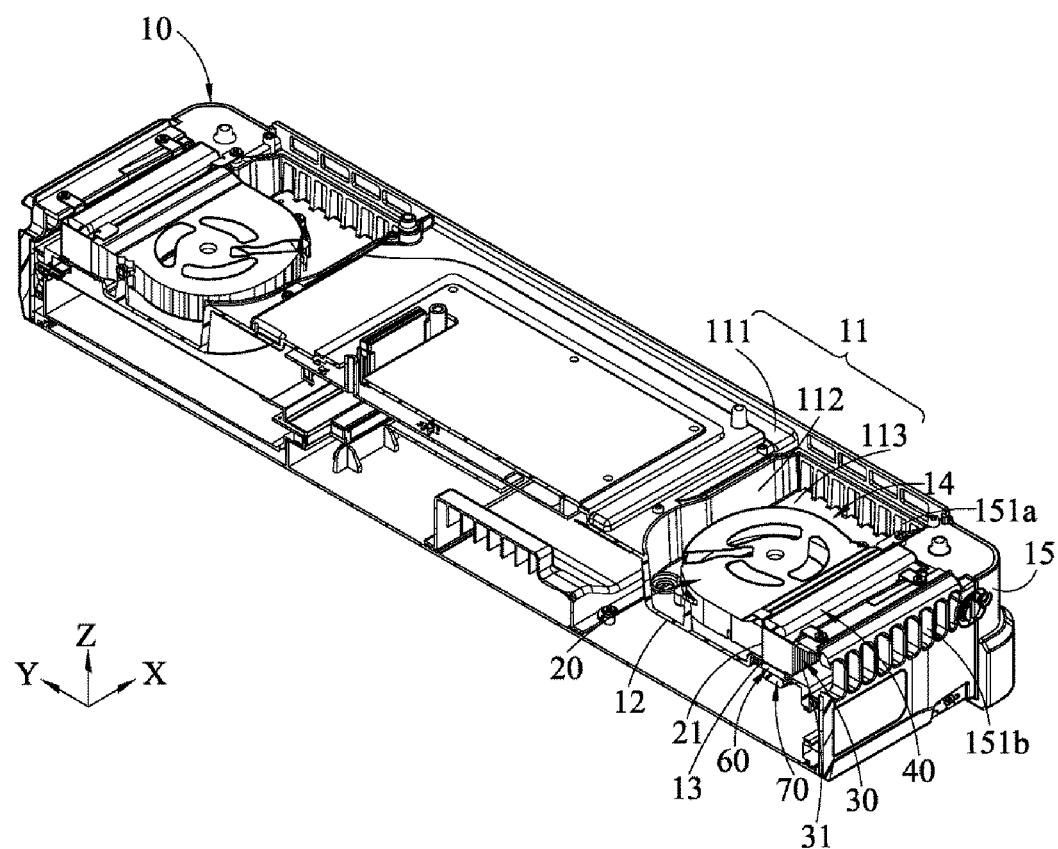
FIG. 9 is a third perspective sectional schematic diagram of an electronic device according to an embodiment of the present invention.

Referring to FIG. 4 to FIG. 9, FIG. 4 shows a partial enlarged schematic diagram of a circled portion 4 in FIG. 3, FIG. 5 shows a partial exploded structural schematic diagram of an electronic device according to an embodiment of the present invention, FIG. 6 shows a partial exploded structural schematic diagram of an electronic device according to another embodiment of the present invention, FIG. 7 shows a second perspective sectional schematic diagram of an electronic device according to an embodiment of the present invention, and FIG. 8 shows a second planar sectional schematic diagram of an electronic device according to an embodiment of the present invention. Herein, FIG. 8 is drawn according to a YZ planar direction defined by the Y direction and the Z direction. FIG. 9 shows a third perspective sectional schematic diagram of an electronic device according to an embodiment of the present invention. The fan 20 is disposed in the body 10 and has an air outlet 21 (as shown in FIG. 9). The heat sink assembly 30 is disposed at the air outlet 21. One end of the first thermal tube 40 is assembled on one side of the heat sink assembly 30. The first heat source 50 is disposed in the body 10 at a position corresponding to the other end of the first thermal tube 40 (as shown in FIG. 7). One end of the second thermal tube 70 is connected to the other side of the heat sink assembly 30 (referring to FIG. 4). The second heat source 80 is disposed in the body 10 at a position corresponding to the other end of the second thermal tube 70 (referring to FIG. 7), and the second heat source 80 and the first heat source 50 are not coplanar (as shown in FIG. 8).

Thus, the electronic device is capable of dissipating heat from the first heat source 50 and the second heat source 80 that are not coplanar on the electronic device by using one single fan 20, hence reducing the space needed for achieving heat dissipation and enhancing space utilization efficiency of the electronic device.

Referring to FIG. 3 to FIG. 5, in some embodiments, the body 10 is a hollow frame structure and has an outer surface 11 and an inner surface 12 opposite to each other, and a through opening 13 passing through the outer surface 11 and the inner surface 12. In these embodiments, a range surrounded by the inner surface 12 defines an accommodating space for accommodating the first heat source 50 and the second heat source 80, and the fan 20 is disposed on the outer surface 11 of the body 10.

Referring to FIG. 3 to FIG. 7 as well as FIG. 9, in these embodiments, the position of the heat sink assembly 30 corresponds to the through opening 13, so that one side of the heat sink assembly 30 is exposed on the outer surface 11 and the other opposite side corresponds to the position of the through opening 13. Thus, one end of the first thermal tube 40 can be assembled on one side of the heat sink assembly 30 exposed on the outer surface 11, and one end of the second thermal tube 70 can correspond to the other side of the heat sink assembly 30. As such, the first thermal tube 40 is allowed to extend on the outer surface 11 of the body 10 so that the first heat source 50 can be disposed at a position near the outer surface 11 of the body 10, and the second thermal tube 70 is allowed to extend in an internal space of the body 10 so that the second heat source 80 can also be disposed in the internal space of the body 10, thereby satisfying different requirements of placement positions of the first heat source 50 and the second heat source 80.

Referring to FIG. 3 to FIG. 6, to ensure the waterproofness of the internal space of the body 10, in these embodiments, a thermal plate 60 is further included, and the body 10 further includes a sidewall 15. The sidewall 15 is disposed along contours of the outer surface 11 and the inner surface 12, and the sidewall 15 and the inner surface 12 define the internal space. The thermal plate 60 is disposed in the body 10 at a position corresponding to the through opening 13, and one side of the thermal plate 60 abuts against the other side of the heat sink assembly 30 and the inner surface 12. Thus, the thermal plate 60 seals the through opening 13 so as to ensure the waterproofness of the internal space of the body 10.

Referring to FIG. 6, in another embodiment, the thermal plate 60 is a planar structure, and the thermal plate 60 seals the through opening 13 by a planar connection; however, the present invention is not limited to the example above.

Referring to FIG. 4 and FIG. 5, the structural form of the thermal plate 60 is not limited to the planar structure of the above embodiment. In some embodiments, the thermal plate 60 includes a contacting portion 61 and an abutting portion 62 connected to each other, wherein the contacting portion 61 passes through the through opening 13 and abuts against the other side of the heat sink assembly 30, and one side of the abutting portion 62 abuts against the inner surface 12 of the body 10.

One end of the second thermal tube 70 may be connected to the other side of the abutting portion 62 (as shown in FIG. 4), and the second heat source 80 is disposed at a position corresponding to the other end of the second thermal tube 70 (as shown in FIG. 3), so that the second thermal tube 70 and the second heat source 80 can be both disposed in the waterproof internal space in the body 10. Further, although the first thermal tube 40 extends on the outer surface 11 of the body 10, the first heat source 50 can still be disposed in the internal space formed by the sidewall 15 and the inner surface 12, and by disposing the first heat source 50 at a position in the internal space close to the outer surface 11, the first thermal tube 40 is in indirect contact with the first heat source 50 through the outer surface 11, thereby ensuring that the first heat source 50 is located in the waterproof internal space while receiving heat conduction from the first heat source 40 so as to achieve heat dissipation.

Referring to FIG. 4 and FIG. 5, in some embodiments, the shape of an appearance of the contacting portion 61 of the thermal plate 60 corresponds to the shape of the through opening 13, and an outer contour of the abutting portion 62 is greater than an outer contour of the contacting portion 61, so that the overall side surface of the thermal plate 60 appears similar to a convex form. In these embodiments, the contacting portion 61 of the thermal plate 60 passes through the through opening 13 and abuts against the heat sink assembly 30 so as to reliably transfer heat energy, and the abutting portion 62 abuts against the inner surface 12 of the body 10 and covers the through opening 13 so that the through opening 13 is sealed by the thermal plate 60, hence reducing moisture or dust outside the body 10 entering the inside of the body 10 through the through opening 13 and ensuring waterproofness and dustproofness at the through opening 13.

Referring to FIG. 4 and FIG. 5, in some embodiments, in order to further enhance the waterproofness of the internal space of the electronic device, the electronic device further includes a waterproof ring 63. In these embodiments, the waterproof ring 63 is made of a flexible material (for example but not limited to, silicone or rubber), and is sleeved at the contacting portion 61 of the thermal plate 60. Thus, the waterproof ring 63 is allowed to be located tightly against the contacting portion 61. When the thermal plate 60 passes through the through opening 13 by the contacting portion 61, the waterproof ring 63 encircles the through opening 13, such that the waterproof ring 63 is sandwiched between the abutting portion 62 of the thermal plate 60 and the inner surface 12 of the body 10. With the flexibility provided by the waterproof ring 63, the thermal plate 60 can be more tightly assembled on the body 10, while the waterproofness is enhanced.

Referring to FIG. 7 and FIG. 9, in some embodiments, to ensure the levelness of the outer surface 11 after the fan 20 is disposed in the electronic device and to better facilitate expansion applications or storage of the electronic device, a recess 14 is provided on the outer surface 11 of the electronic device to accommodate the fan 20. In these embodiments, the outer surface 11 of the body 10 includes a first portion 111, a second portion 112 and a third portion 113. Two ends of the second portion 112 are respectively connected at an angle to the first portion 111 and the third portion 113, the first portion 111 and the third portion 113 are not coplanar, and the sidewall 15 is connected to all of the first portion 111, the second portion 112 and the third portion 113. Thus, the second portion 112, the third portion 113 and the sidewall 15 jointly define the recess 14, and the fan 20 and the heat sink assembly 30 are disposed in the recess 14. Moreover, the through opening 13 passes through the third portion 113, so that the position of the air outlet 21 of the fan 20 accommodated in the recess 14 corresponds to the heat sink assembly 30 disposed at the through opening 13.

In some embodiments, to ensure the operation of the fan 20, the sidewall 15 is provided, at a position corresponding to the recess 14, with a through hole 151 that is in communication with the recess 14. In these embodiments, the through hole 151 may include a plurality of first through holes 151a and a plurality of second through holes 151b, and the fan 20 is capable of drawing in air through the first through holes 151a to generate a cooling air flow, as shown in FIG. 1, FIG. 2 and FIG. 9. Moreover, the fan 20 discharges a heat dissipating air flow from the air outlet 21 through the second through holes 151b, as shown in FIG. 1, FIG. 7 and FIG. 9.

Figure 10:
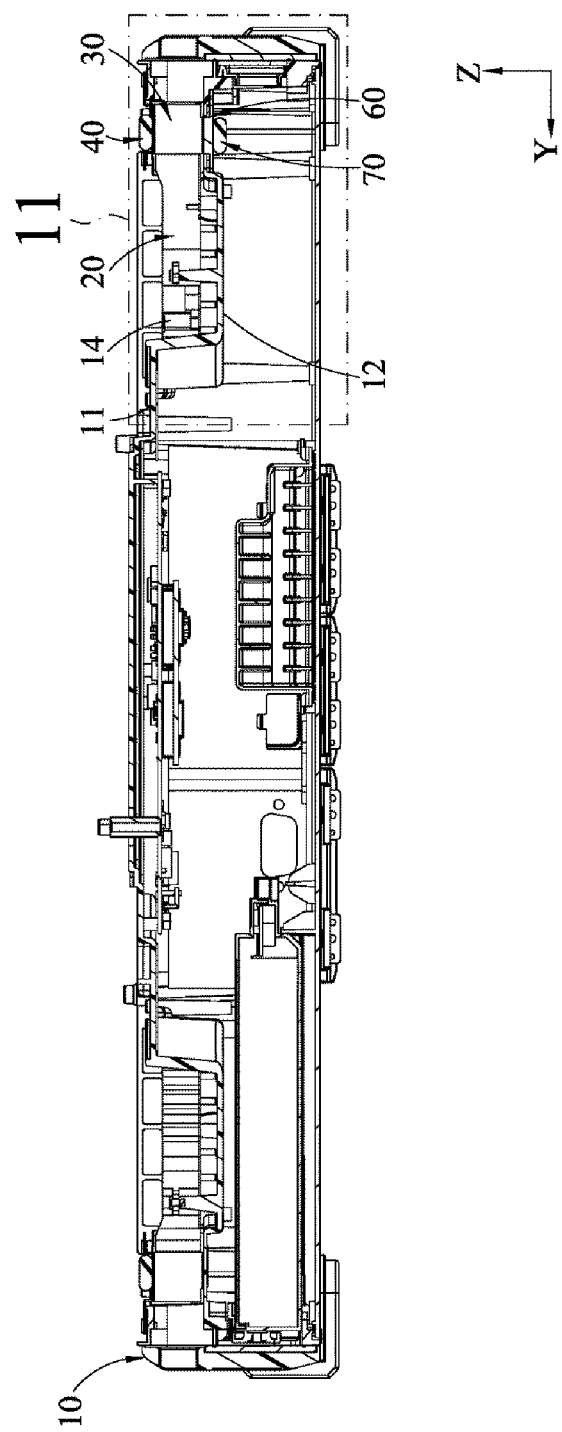
FIG. 10 is a third planar sectional schematic diagram of an electronic device according to an embodiment of the present invention.
Figure 11:
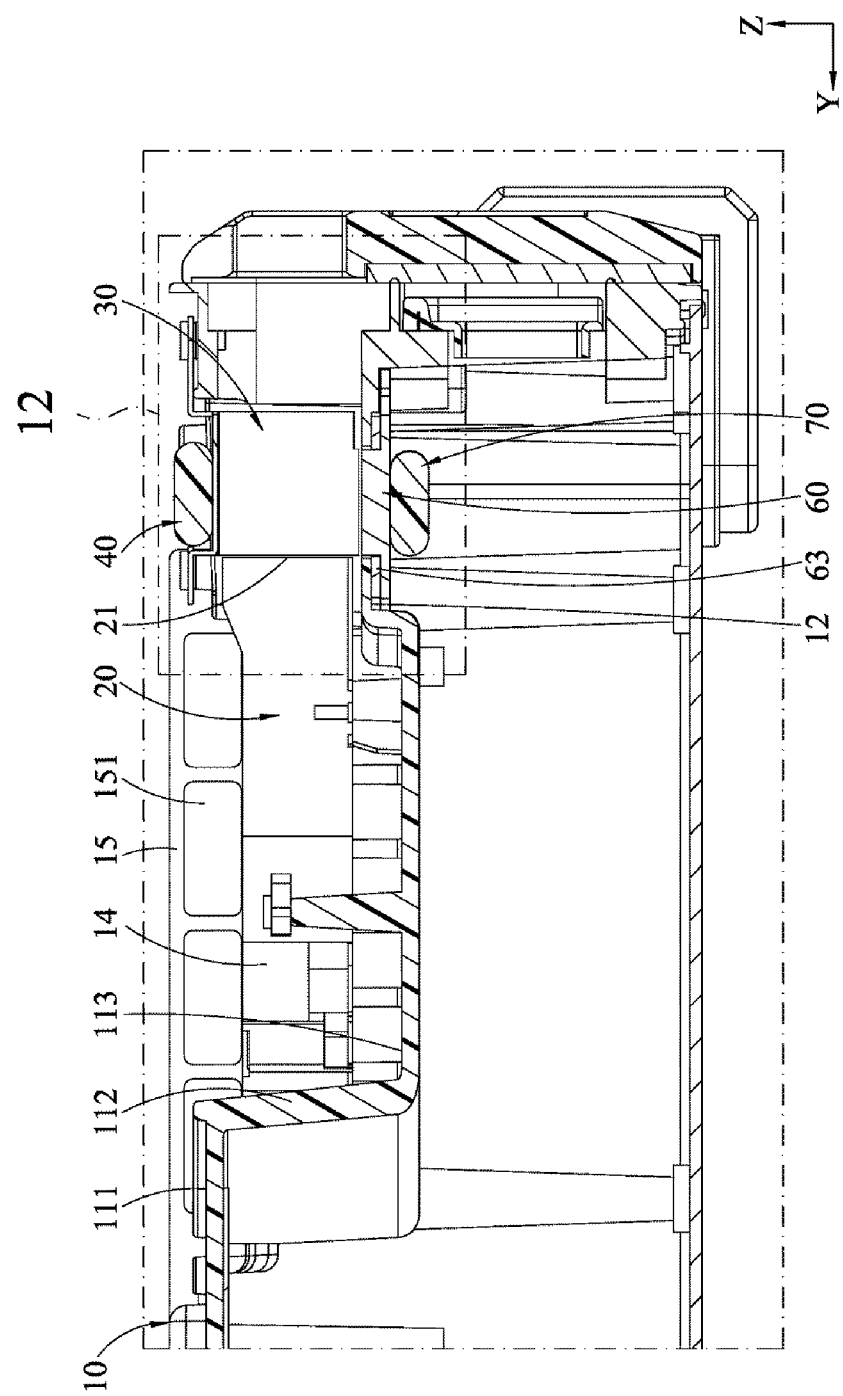
FIG. 11 is a partial enlarged schematic diagram of a circled portion 11 in FIG. 10.
Figure 12:
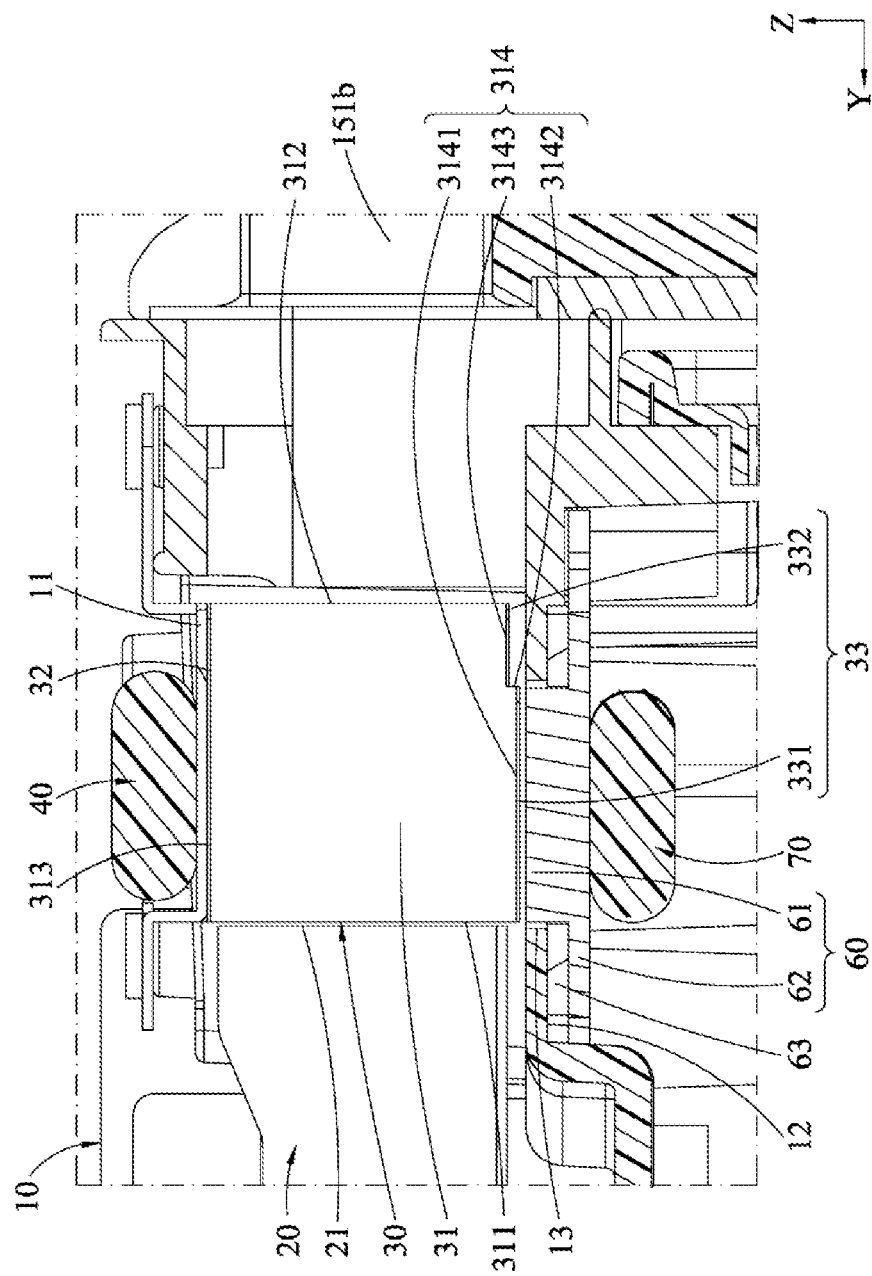
FIG. 12 is a partial enlarged schematic diagram of a circled portion 12 in FIG. 11.

Referring to FIG. 9 to FIG. 13, FIG. 10 shows a third planar sectional schematic diagram of an electronic device according to an embodiment of the present invention. Herein, FIG. 10 is drawn according to a YZ planar direction defined by the Y direction and the Z direction. FIG. 11 shows a partial enlarged diagram of a circled portion 11 in FIG. 10, and FIG. 12 shows a partial enlarged diagram of a circled portion 12 in FIG. 11. In some embodiments, the heat sink assembly 30 includes a plurality of cooling fins 31 spaced from one another in parallel in an integral arrangement (as shown in FIG. 9). Each of the cooling fins 31 of the heat sink assembly 30 has a first side 311, a second side 312, a third side 313 and a fourth side 314. The first side 311 and the second side 312 are parallel and opposite to each other, the third side 313 and the fourth side 314 are parallel and opposite to each other, and the third side 313 and the fourth side 314 are respectively connected between the first side 311 and the second side 312 (referring to FIG. 12). In these embodiments, an air passage is formed between two adjacent cooling fins 31, and the first side 311 and the second side 312 of the cooling fins 31 are two ends of the air passage. Thus, the heat sink assembly 30 is adjacent to the fan 20 by the first side 311, the first thermal tube 40 is assembled on the third side 313, and the thermal plate 60 is assembled on the fourth side 314. Herein, the second through holes 151b are disposed on the sidewall 15 of the body 10 at positions corresponding to the second sides 312 of the cooling fins 31 to discharge air flowing through the air passages of the heat sink assembly 30 (as shown in FIG. 9 and FIG. 12).

Referring to FIG. 12, in some embodiments, to ensure that air discharged from the air outlet 21 of the fan 20 can reliably flow through the air passages among the cooling fins 31 to achieve a thorough heat dissipation effect, the heat sink assembly 30 further includes an upper plate 32 and a lower plate 33. The upper plate 32 is perpendicular to the cooling fins 31 and is disposed on the third side 313 of each of the cooling fins 31, and the lower plate 33 is perpendicular to the cooling fins 31 and is disposed on the fourth side 314 of each of the cooling fins 31. Thus, it is ensured that the air discharged from the air outlet 21 of the fan 20 can completely enter the air passages to contact the cooling fins 31 so as to achieve an optimal heat dissipation effect. Moreover, the first thermal tube 40 may also be connected to the upper plate 32, and the thermal plate 60 may be connected to the lower plate 33. In addition to enhancing the stability of the first thermal tube 40 and the thermal plate 60 assembled at the heat sink assembly 30, the upper plate 32 and the lower plate 33 are capable of increasing the areas of the first thermal tube 40 and the thermal plate 60 contacting the heat sink assembly 30, enhancing the heat dissipation effect.

Referring to FIG. 12, in some embodiments, the fourth side 314 of each of the cooling fins 31 includes a first section 3141, a second section 3142 and a third section 3143. The first section 3141 is perpendicularly connected to first side 311, the third section 3143 is perpendicularly connected to the second side 312, the second section 3142 is perpendicularly connected to the first section 3141 and the third section 3143, and a position of the first section 3141 corresponds to a position of the through opening 13. Thus, with the first section 3141 provided, the fourth side 314 of each of the cooling fins 31 of the heat sink assembly 30 can abut against by the thermal plate 60 passing through the through opening 13 to achieve the heat dissipation effect, and the second section 3142 and the third section 3143 connected to the first section 3141 can extend the length of each of the cooling fins 31, increasing the area of the air discharged from the fan 20 contacting the cooling fins 31 and enhancing the heat dissipation efficiency.

Referring to FIG. 12, in some embodiments, the first section 3141, the second 3142 and the third section 3143 of the fourth side 314 of each of the cooling fins 31 are not coplanar. In these embodiments, the third section 3143 is closer to the third side 313 than the first section 3141, so that the fourth side 314 of each of the cooling fins 31 forms a stepped pattern having a height difference. In these embodiments, the lower plate 33 includes a first lower plate 331 and a second lower plate 332. The first lower plate 331 is disposed on the first section 3141 of the fourth side 314, the second lower plate 332 is disposed on the third section 3143 of the fourth side 314, and the contacting portion 61 of the thermal plate 60 abuts against the first lower plate 331. Thus, since the second lower plate 332 is disposed on the third section 3143 closer to the third side 313 than the first section 3141 and a gap is produced between the second lower plate 332 and the nearby outer surface 11 of the body 10, a yield space is provided for a fixing member (for example, a screw locking member) locked at the outer surface 11, further enhancing space utilization efficiency.

Figure 13:
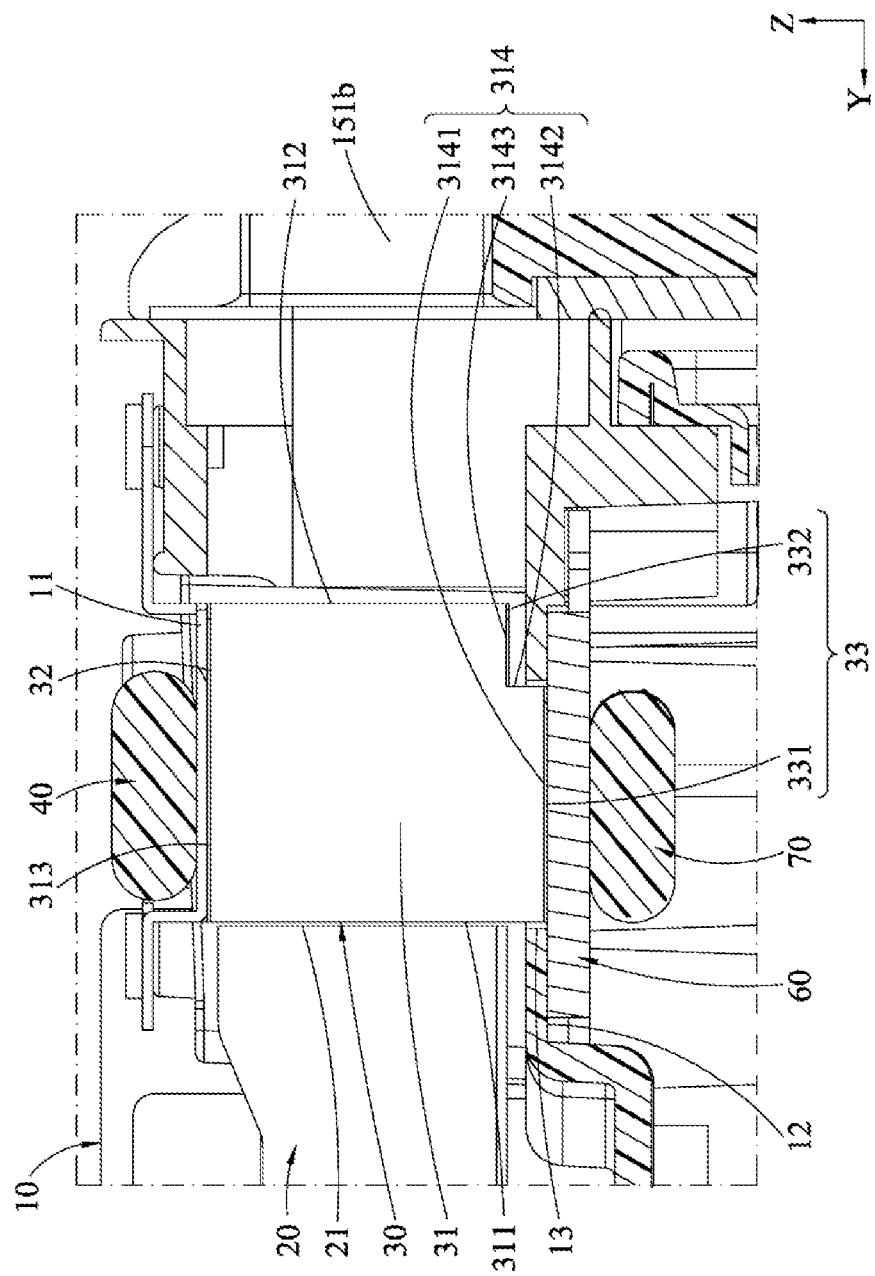
FIG. 13 is a schematic diagram of a circled portion 12 in FIG. 11 according to another implementation form.

Referring to FIG. 13, in another embodiment in which the thermal plate 60 is a planar structure, a portion (for example, the first sections 3141 of the fourth sides 314) of the cooling fins 31 of the heat sink assembly 30 passes through the through opening 13 and abuts against the thermal plate 60 to transfer heat energy, and to ensure waterproofness and dustproofness at the through opening 13.

Figure 14:
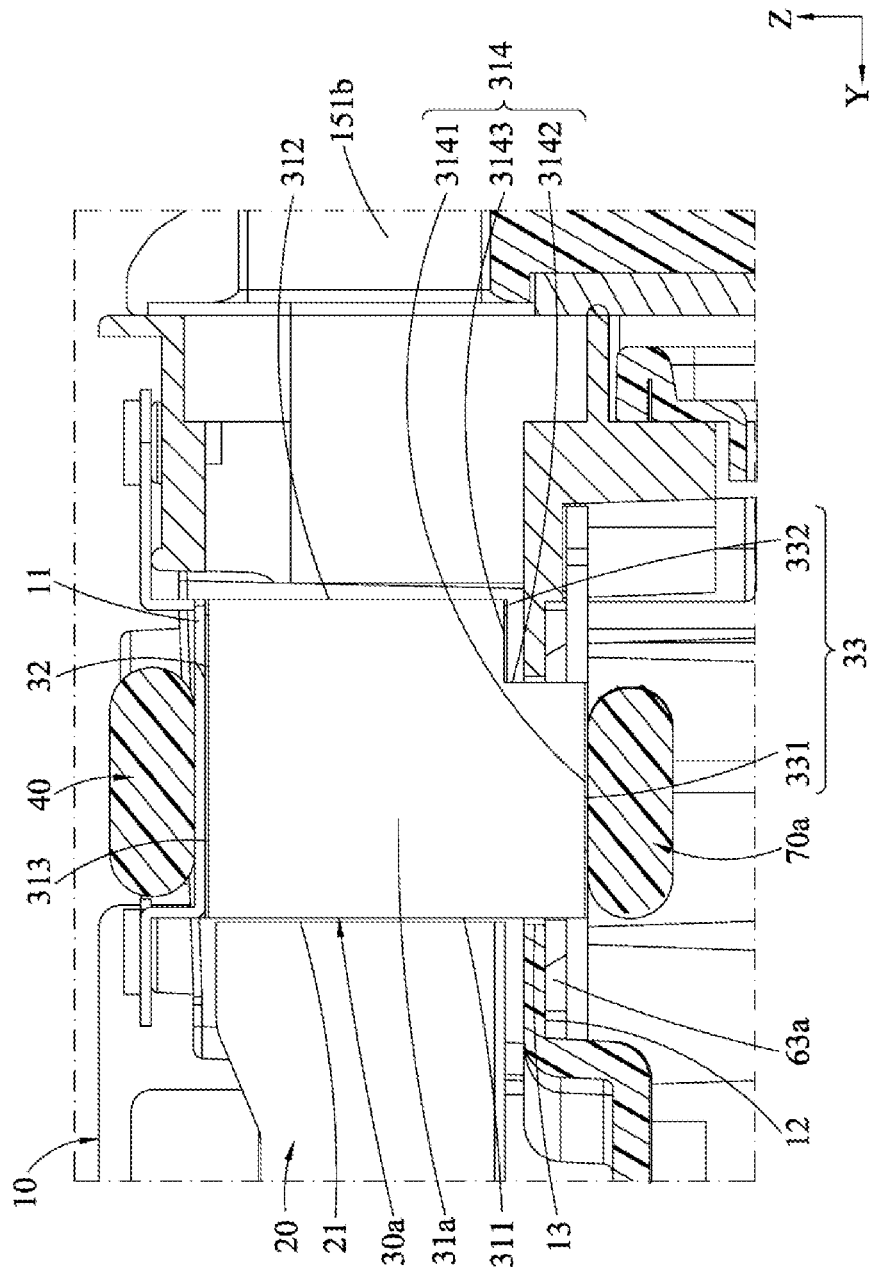
FIG. 14 is a schematic diagram of the circled portion 12 in FIG. 11 according to yet another implementation form.

Referring to FIG. 14, in yet another embodiment, a portion (for example, the first sections 3141 of the fourth sides 314) of cooling fins 31a of a heat sink assembly 30a passes through the through opening 13 and abuts against a second thermal tube 70a to transfer heat energy. A waterproof ring 63a encircles the through opening 13 and a portion of the cooling fins 31a, and the waterproof ring 63a is sandwiched between the inner surface 12 of the body 10 and the second thermal tube 70a, thus ensuring the waterproofness and dustproofness at the through opening 13.

Figure 15:
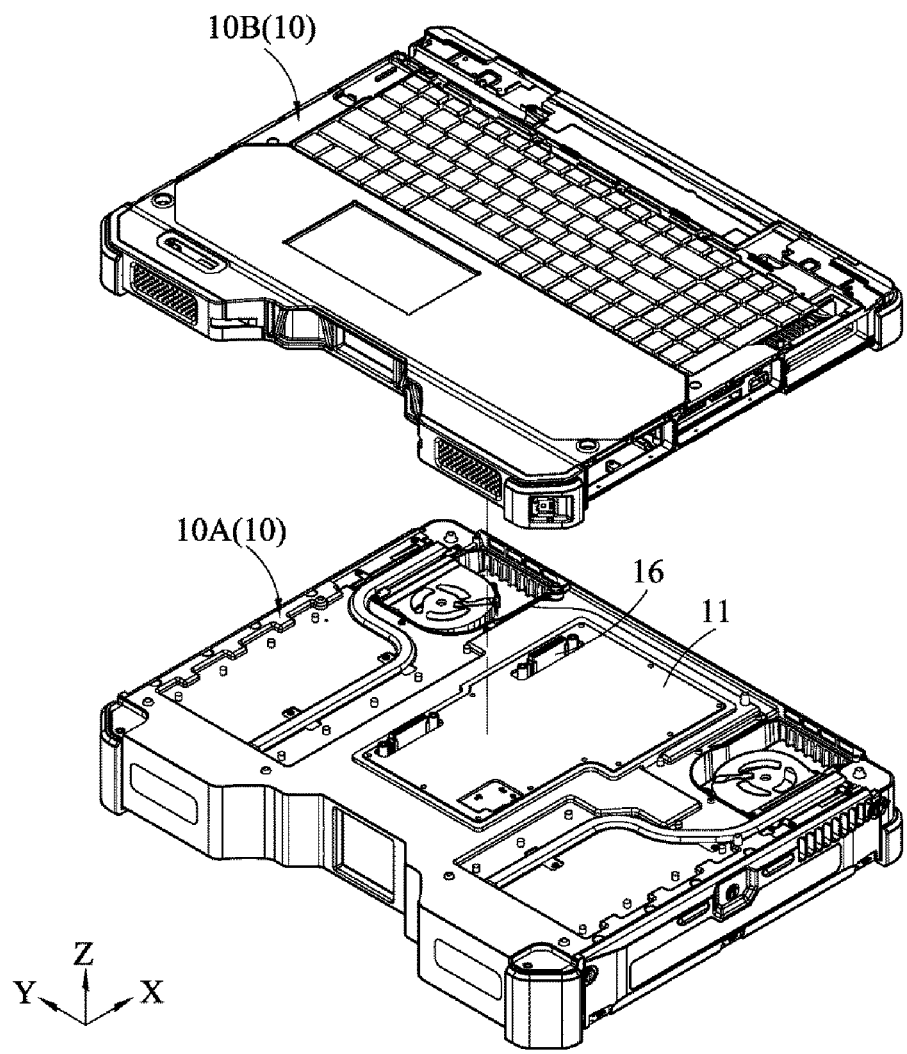
FIG. 15 is a schematic diagram of a body of an electronic device of the present invention expansion connected to another body.

Referring to FIG. 15, in some embodiments in which the electronic device is an expansion dock, the body 10 of the electronic device may include a first body 10A and a second body 10B. In these embodiments, the first body 10A further includes an expansion port 16, which is disposed on the outer surface 11 to expansion connect in an overlapping manner to the second body 10B, thereby enhancing utilization diversity.

Moreover, the first heat source 50 and the second heat source 80 are electronic components that generate heat due to operations in the electronic device, and are, for example but not limited to, a communication module (e.g., 4G/5G communication module), a memory, a graphics card, a central processing unit (CPU), a graphics processing unit (GPU), a battery or a hard drive device.

The present invention is disclosed as the embodiments above. However, these embodiments are not to be construed as limitations to the present invention. Slight modifications and variations may be made to the embodiments by a person skilled in the art without departing from the spirit and scope of the present invention. Therefore, the scope of legal protection of the present invention should be defined by the appended claims.

What is claimed is:
1. An electronic device, comprising:
   a body, comprising a through opening, and an outer surface and an inner surface opposite to each other, wherein the through opening passes through the outer surface and the inner surface;
a fan, disposed on the outer surface of the body, the fan having an air outlet;
a heat sink assembly, disposed at the air outlet and corresponding to the through opening, wherein:
the heat sink assembly comprises a plurality of cooling fins, an upper plate, and a lower plate,
each of the plurality of cooling fins has a first side, a second side, a third side, and a fourth side,
the first side and the second side are parallel and opposite to each other,
the third side and the fourth side are parallel and opposite to each other,
the third side and the fourth side are respectively connected between the first side and the second side,
the first side is adjacent to the fan,
the upper plate is perpendicular to the plurality of cooling fins and is disposed on the third side,
the lower plate is perpendicular to the plurality of cooling fins and is disposed on the fourth side,
the fourth side comprises a first section, a second section, and a third section,
the first section is perpendicularly connected to the first side,
the third section is perpendicularly connected to the second side,
the second section is perpendicularly connected to the first section and the third section, and
a position of the first section corresponds to a position of the through opening;
a first thermal tube, having one end thereof assembled on the heat sink assembly, and located on a side of the outer surface;
a first heat source, disposed at a position corresponding to a second end of the first thermal tube;
a thermal plate, disposed in the body and corresponding to the through opening, one side of the thermal plate abutting against the heat sink assembly and the inner surface;
a second thermal tube, having one end thereof connected to a second side of the thermal plate such that the first thermal tube is separated from the second thermal tube by the heat sink assembly and the thermal plate that are disposed between the first thermal tube and the second thermal tube; and
a second heat source, disposed at a position corresponding to a second end of the second thermal tube.

2. The electronic device according to claim 1, wherein the first heat source and the second heat source are disposed in the body and are not coplanar.

3. The electronic device according to claim 1, wherein:
the body further comprises a sidewall,
the outer surface of the body comprises a first portion, a second portion, and a third portion,
the second portion is connected at an angle to the first portion and the third portion,
the first portion and the third portion are not coplanar,
the sidewall is connected to the first portion, the second portion, and the third portion,
the second portion, the third portion, and the sidewall define a recess therebetween, and
the fan is disposed in the recess.

4. The electronic device according to claim 3, wherein the first heat source, the second heat source, and the second thermal tube are located between the sidewall and the inner surface.

5. The electronic device according to claim 3, wherein the sidewall comprises a plurality of through holes which are in communication with the recess.

6. The electronic device according to claim 1, wherein:
the thermal plate comprises a contacting portion and an abutting portion connected to each other,
the contacting portion passes through the through opening and abuts against the heat sink assembly, and
the abutting portion abuts against the inner surface.

7. The electronic device according to claim 6, further comprising:
a waterproof ring, disposed on the inner surface and encircling the through opening, wherein,
the contacting portion passes through the waterproof ring to abut against the heat sink assembly, and
one side of the abutting portion abuts against the waterproof ring.

8. The electronic device according to claim 7, wherein the waterproof ring protrudes from the inner surface.

9. The electronic device according to claim 1, wherein:
the first thermal tube is assembled on the third side of each of the plurality of cooling fins, and
the thermal plate is assembled on the fourth side of each of the plurality of cooling fins.

10. The electronic device according to claim 9, wherein;
the first thermal tube is connected to the upper plate, and
the thermal plate is connected to the lower plate.

11. The electronic device according to claim 1, wherein:
the lower plate comprises a first lower plate and a second lower plate,
the first lower plate is disposed on the first section,
the second lower plate is disposed on the third section, and
the thermal plate abuts against the first lower plate.

12. The electronic device according to claim 1, wherein the body further comprises:
an expansion port, disposed on the outer surface and used to expansion connect to another body.

13. An electronic device, comprising:
a body, comprising a through opening;
a fan, disposed in the body, the fan having an air outlet;
a heat sink assembly, disposed at the air outlet, wherein:
the heat sink assembly comprises a plurality of cooling fins, an upper plate, and a lower plate,
each of the plurality of cooling fins has a first side, a second side, a third side, and a fourth side,
the first side and the second side are parallel and opposite to each other,
the third side and the fourth side are parallel and opposite to each other,
the third side and the fourth side are respectively connected between the first side and the second side,
the first side is adjacent to the fan,
the upper plate is perpendicular to the plurality of cooling fins and is disposed on the third side,
the lower plate is perpendicular to the plurality of cooling fins and is disposed on the fourth side,
the fourth side comprises a first section, a second section, and a third section,
the first section is perpendicularly connected to the first side,
the third section is perpendicularly connected to the second side,
the second section is perpendicularly connected to the first section and the third section, and
a position of the first section corresponds to a position of the through opening;

a first thermal tube, having one end thereof assembled on one side of the heat sink assembly;
a first heat source, disposed in the body at a position corresponding to a second end of the first thermal tube;
a thermal plate, wherein one side of the thermal plate abuts against the heat sink assembly;
a second thermal tube, having one end thereof connected to a second side of the heat sink assembly, wherein the first thermal tube and the second thermal tube are disposed on opposite sides of the thermal plate such that the first thermal tube is separated from the second thermal tube by the heat sink assembly and the thermal plate that are disposed between the first thermal tube and the second thermal tube; and
a second heat source, disposed in the body at a position corresponding to a second end of the second thermal tube, wherein the second heat source and the first heat source are not coplanar.

14. The electronic device according to claim 13, wherein the body has a recess in which the fan and the heat sink assembly are disposed.

15. The electronic device according to claim 14, wherein the through opening passes through the recess and corresponds to the heat sink assembly.

16. The electronic device according to claim 15, wherein the first thermal tube is located on an outer surface of the body, and the second thermal tube is located on an inner surface of the body.

17. The electronic device according to claim 16, further comprising:
a waterproof ring, encircling the through opening and sandwiched between the inner surface of the body and the second thermal tube.

18. The electronic device according to claim 17, wherein a portion of the heat sink assembly passes through the waterproof ring and abuts against the second thermal tube.

19. The electronic device according to claim 14, wherein the body further comprises a plurality of through holes which are in communication with the recess.

20. The electronic device according to claim 13, wherein:
the first thermal tube is assembled on the third side of each of the plurality of cooling fins,
the thermal plate is assembled on the fourth side of each of the plurality of cooling fins,
the first thermal tube is connected to the upper plate, and
the thermal plate is connected to the lower plate.

* * * * *